United States Patent [19]

Shigenaka et al.

[11] Patent Number: 5,641,973

[45] Date of Patent: Jun. 24, 1997

[54] SEMICONDUCTOR PIEZOELECTRIC PHOTOELECTRIC CONVERTING DEVICE AND IMAGING DEVICE USING SUCH SEMICONDUCTOR PHOTOELECTRIC CONVERTING DEVICE

[75] Inventors: Keitaro Shigenaka, Tokyo; Keiichi Matsushita, Yokohama; Katsuyoshi Fukuda, Yokosuka, all of Japan

[73] Assignee: Kabushiki Kaisha Toshiba, Kawasaki, Japan

[21] Appl. No.: 527,582

[22] Filed: Sep. 13, 1995

[30] Foreign Application Priority Data

Sep. 16, 1994 [JP] Japan .................... 6-221442

[51] Int. Cl.$^6$ .................... H01L 31/00
[52] U.S. Cl. .................... 257/40; 257/441; 257/442; 257/443; 257/467; 359/350; 250/332
[58] Field of Search ................ 257/442, 441, 257/444, 443, 40, 467; 359/350; 250/332

[56] References Cited

U.S. PATENT DOCUMENTS

| | | |
|---|---|---|
| 4,485,305 | 11/1984 | Kuwand et al. .................... 250/338 |
| 4,584,475 | 4/1986 | Lao .................... 250/332 |
| 4,799,244 | 1/1989 | Mikoshiba et al. .................... 377/58 |
| 5,048,969 | 9/1991 | Deason et al. .................... 356/432 |

*Primary Examiner*—William Mintel
*Attorney, Agent, or Firm*—Oblon, Spivak, McClelland, Maier & Neustadt, P.C.

[57] ABSTRACT

A semiconductor photoelectric converting device and an imaging device using such semiconductor photoelectric converting devices are provided according to the present invention, the semiconductor photoelectric converting device including an electric charge transfer area provided in a surface portion of a semiconductor substrate and a light-receiving area formed of a piezoelectric material, electrically connected to the electric charge transfer area and provided in contact with the semiconductor substrate, in which electric charges generated by a piezoelectric effect produced by a strain resulting from heat evolved upon the falling of light onto the light-receiving area are conducted to the charge transfer area.

20 Claims, 3 Drawing Sheets

SEMICONDUCTOR PIEZOELECTRIC PHOTOELECTRIC CONVERTING DEVICE AND IMAGING DEVICE USING SUCH SEMICONDUCTOR PHOTOELECTRIC CONVERTING DEVICE

BACKGROUND OF THE INVENTION

1. Field of the Invention

The present invention relates to a semiconductor photoelectric converting device, more particularly relates to a semiconductor photoelectric converting device as an infrared light receiving element.

2. Description of the Related Art

An infrared detector for use in an infrared type imaging system can be classified into a photon detector using a semiconductor in principle, a pyroelectric type detector utilizing a pyroelectric effect and a Seebeck type detector utilizing a Seeback effect.

As the photon detector, a structure as shown, for example, in FIG. 1 is known in which it includes a charge transfer substrate unit 3 having charge transfer elements in its silicon substrate 1, a light-receiving substrate unit 7 having a p type HgCdTe layer 5 and n type HgCdTe regions 6 in its CdZnTe substrate 4, and indium metal posts 8 by which the charge transfer substrate unit 3 is electrically connected to the light-receiving substrate unit.

When the conventional photon detector having an arrangement as set out above is brought to a temperature in proximity to room temperature so that it may detect radiation in the neighborhood of room temperature, then electric charges developed due to heat evolved in the detector itself will be mixed, as noise, with those electric charges created due to heat from an infrared radiation containing object information because a band gap in the materials constituting the detector is as small as about 0.12 eV. In the conventional photon detector, therefore, it is not possible to accurately detect any infrared radiation other than that of high output power as in a $CO_2$ gas laser and hence to obtain a clear-cut image in an imaging system utilizing it. In the imaging system utilizing the conventional photon detector, a cooling system such as a Joule Thomson type cooling unit and Stirling cycle type cooling unit is provided to cool it to about the liquid nitrogen temperature (absolute temperature 77 K.). By doing so it is possible to detect the infrared radiation with high sensitivity. A resultant imaging system becomes bulkier and higher in manufacturing costs and is restricted to the application of a defense equipment as well as a space equipment.

Further, the pyroelectric type detector is adapted to convert infrared radiation to an electric signal but it is lower in sensitivity. The Seebeck type detector converts infrared radiation to heat and the heat to an electric signal, but its response speed is slow.

SUMMARY OF THE INVENTION

It is accordingly the object of the present invention to provide a novel semiconductor photoelectric converting device which can be used at room temperature or at a temperature capable of being cooled by an electronic cooler and achieve a high response speed and a high sensitivity.

According to the present invention, there is provided a semiconductor photoelectric converting device, comprising an electric charge transfer area provided in a surface portion of a semiconductor substrate; and a light-receiving area formed of a piezoelectric material, electrically connected to the electric charge transfer area and provided in contact with the semiconductor substrate; wherein electric charges generated by a piezo effect produced by strain resulting from heat evolved upon the falling of light onto the light-receiving area are conducted to the charge transfer area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
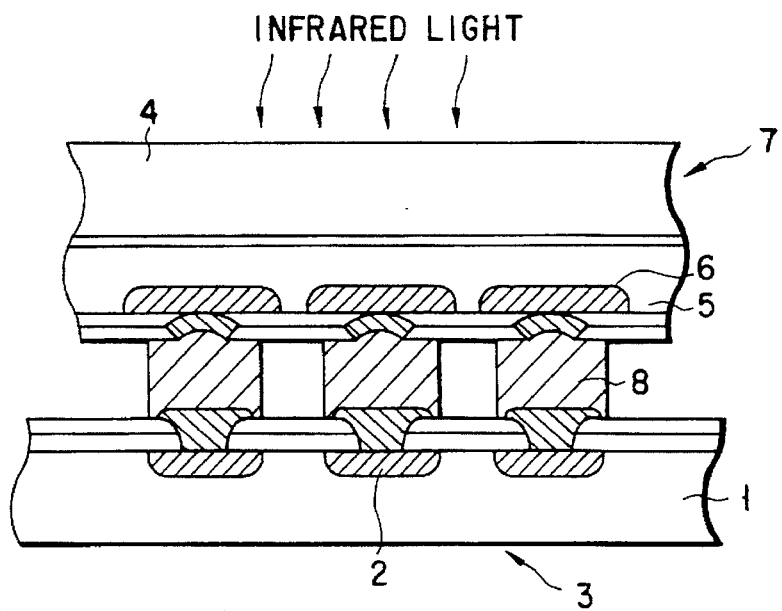
FIG. 1 is a cross-sectional view showing a conventional semiconductor photoelectrical device.

A semiconductor photoelectric converting device of the present invention comprises an electric charge transfer area provided in a surface portion of a semiconductor substrate; and a light-receiving area formed of a piezoelectric material, electrically connected to the electric charge transfer area and provided in contact with the semiconductor substrate; wherein electric charges generated by a piezo effect produced by strain resulting from heat evolved upon the falling of light onto the light-receiving area are conducted to the charge transfer area.

The semiconductor photoelectric converting device enables electric charges generated by a piezo effect produced by strain resulting from heat evolved upon the falling of light onto the light-receiving area to be conducted to the charge transfer area, not electric charges generated due to an absorption of incident light to be conducted to the charge transfer element. It is, therefore, possible to detect light at a response speed faster than on a pyroelectric type detector and with high sensitivity even at a temperature near to room temperature.

Here, as the semiconductor substrate, use can be made of a silicon substrate, a GaAs substrate, etc. By the use of the semiconductor substrate it is possible to provide electric charge transfer areas and light-receiving areas on the same substrate. By the light it is meant an infrared radiation with a wavelength of 0.8 to 20 μm.

As the piezoelectric material constituting the light-receiving area, use can be made of a material, such as PbTe, PbSe, HgSe, HgTe, HgCdTe and InSb, which evolves heat upon absorption of light and generates electric charges resulting from strain produced due to an expansion by heat evolved. The piezoelectric material used for the light-receiving area is properly selected, taking into consideration the detection wavelength of the infrared radiation and easiness of electric processing. Table 1 shows, in more detail, a relation of kinds of piezoelectric materials for use for the light-receiving area to the detection wavelength. In those materials shown in Table 1, it is preferable to use a detection wavelength of more than 3 μm. In particular, PbTe, HgTe, $Hg_{1-x}Cd_xTe$, InSb, $Cd_3As_2$, $Bi_2Te_3$ and $PtSb_2$ are preferable in terms of the detection wavelength. Of them, HgTe, $Cd_3As_2$ and $Bi_2Te_3$ are particularly preferable because the piezoelectric effect becomes greater in combination with silicon if the semiconductor substrate is formed of Si. Regarding $Hg_{1-x}Cd_xTe$, the effect of the present invention is exhibited in a range of $0.16 \leq x \leq 1$, preferably of $0.2 \leq x \leq 0.3$.

TABLE 1

| Kinds of piezoelectric Materials | Bandgap (eV) | Detection wavelength (μm) |
| --- | --- | --- |
| PbTe | 0.31 | −4 |
| PbSe | 0.26 | −4.8 |
| PbS | 0.41 | −3 |
| HgSe | 0.6 | −2.1 |
| HgTe | 0.02 | −20 |
| $Hg_{1-x}Cd_xTe$ | — | variable to 0.8–20 |
| GaSb | 0.72 | −1.7 |
| GaAs | 1.42 | −0.9 |
| InP | 1.35 | −0.9 |
| InAs | 0.36 | −3.4 |
| InSb | 0.17 | −7.3 |
| Ge | 0.66 | −1.9 |
| $Mg_2Si$ | 0.77 | −1.6 |
| $Mg_2Ge$ | 0.74 | −1.7 |
| $Mg_2Sn$ | 0.36 | −3.4 |
| $Ca_2Sn$ | 0.9 | −1.4 |
| $Ca_2Pb$ | 0.46 | −2.7 |
| ZnSb | 0.53 | −2.3 |
| $ZnAs_2$ | 0.9 | −1.4 |
| $Zn_3As_2$ | 0.93 | −1.3 |
| CdSb | 0.46 | −2.7 |
| $CdAs_2$ | 1.0 | −1.2 |
| $Cd_3As_2$ | 0.13 | −9.5 |
| $Bi_2S_3$ | 1.3 | −1 |
| $Bi_2Se_3$ | 0.28 | −4.4 |
| $Bi_2Te_3$ | 0.20 | −6.2 |
| $Sb_2Te_3$ | 0.30 | −4.1 |
| $As_2Se_3$ | 1.6 | −0.8 |
| $As_2Te_3$ | 1.0 | −1.2 |
| $PtSb_2$ | 0.07 | −18 |
| $In_2Se_3$ | 1.25 | −1 |
| $In_2Te_3$ | 1.0 | −1.2 |

If, as the piezoelectric material, at least two materials are used in combination as set out above, it is possible to detect an intermediate one of those wavelengths of the respective materials corresponding to a mixed ratio.

The light-receiving area may be comprised of a light absorbing layer producing heat upon absorption of light and a piezoelectric layer generating electric charges produced by strain resulting from a linear expansion coefficient difference relative to the semiconductor substrate material upon being heated by heat evolved in the light absorbing layer. If, in this case, heat evolved in the light absorbing layer is conducted to the piezoelectric layer, the light absorbing layer and piezoelectric layer may be made in contact with each other or independently without being contacted with each other. As the light-absorbing layer use can be made of a layer formed of an organic material such as polyimide and cyclopentadiene. As the material for the piezoelectric layer use can be made of ZnTe, ZnO, InSb, GaP and GaSb.

According to the present invention, in order to exhibit an adequate piezoelectric effect, it is necessary that there be a difference (inequality) in linear expansion coefficient between the material for the semiconductor substrate and the piezoelectric material or the material for the piezoelectric layer. In this case, the linear expansion coefficient difference may be to such an extent that strain occurs in the piezoelectric material or piezoelectric layer's material at the expansion of the material resulting from heat evolved upon the falling of light onto the light-receiving layer. The piezoelectric capability is influenced by not only the linear expansion coefficient difference between the semiconductor substrate and the light-receiving area but also the depth (thickness) of the light-receiving area. The depth of the light-receiving area, depending upon the material of the light-receiving area, is preferably 1 to 20 μm.

The charge transfer area and light-receiving area are connected to each other by a metal connection line, etc.

According to the present invention, an imaging device can be constructed by providing the respective semiconductor photoelectric converting device on a per-pixel basis and providing a drive section for transferring electric charges from the electric charge transfer area. In this case, the side wall of the semiconductor substrate defined by the light-receiving area has a (111) plane preferably. This is because the piezoelectric effect of the light-receiving area is enhanced if the side wall is defined by the (111) plane.

The embodiments of the present invention will be explained below with reference to the accompanying drawings.

(Embodiment 1)

Figure 2:
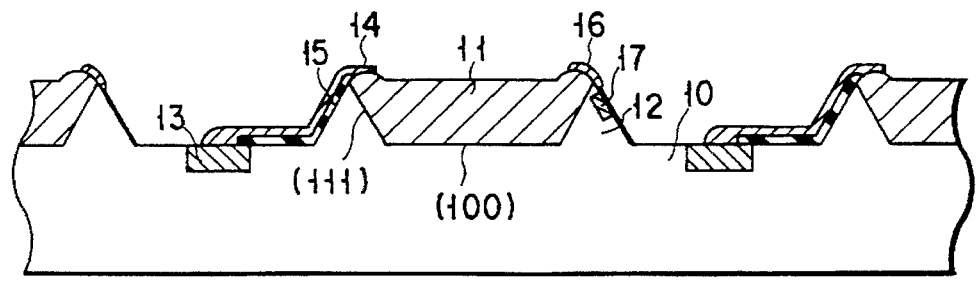
FIG. 2 is a cross-sectional view showing a portion of a semiconductor photoelectric converting device according to the present invention.

FIG. 2 is a cross-sectional view showing an embodiment of a semiconductor photoelectric converting device of the present invention. In FIG. 2, reference numeral 10 shows a p type silicon substrate having a (100) plane. An array of recesses is provided in the surface of the silicon substrate 10 with light-receiving areas 11 formed in an alternate way. The light-receiving area 11 is formed with a piezoelectric material filled in those recesses defined by a silicon wall 12 having a (111) plane. By forming the silicon wall 12 in a way to have the (111) plane exposed, the direction in which stress is applied to the piezoelectric material is oriented to a direction of the dielectric polarization of the piezoelectric material, so that the detection sensitivity is improved. Since recesses are provided in the areas other than the light-receiving areas, that is, those areas between the silicon walls 12 where no piezoelectric materials are filled, a heat insulation effect is exhibited by the recesses defined between the piezoelectric materials, that is, between pixels. Further, the pixel-to-pixel heat insulation effect can further improved by forming a trench, etc., in the bottom surface portion of the recesses, that is, the areas other than the light-receiving areas.

A charge transfer area 13 is provided in the bottom surface portion of the recesses other than the light-receiving areas. The light-receiving area 11 is electrically connected by a gold wiring 14 to the charge transfer area 13. A silicon oxide film 15 is present between the gold wiring 14 and the silicon substrate 10. An aluminum connection line 16 is provided to make electrical connection to the light-receiving area. A ground line 17 is provided on the silicon wall 12 where the aluminum wiring 16 is formed. An electric charge from the ground line 17 is accumulated at a capacitor in the device and transferred. In this way, a semiconductor photoelectric conversion device is constructed.

This semiconductor photoelectric converting device was manufactured as follows. First, a silicon substrate 10 was immersed for 25 minutes at 90° C. in a tetramethylammonium hydroxide solution and a 64×64 array of recesses was formed, as a mutually orthogonal array, with each recess having a 20 μm×20 μm bottom surface and an about 3 μm depth and, by the same anisotropic etching, a 64×64 array of grooves for charge transfer areas was provided in the bottom portions of those alternate recesses in the 64×64 array. The charge transfer area 13 was provided by forming a channel in the groove for the charge transfer area.

After those areas other than the recesses corresponding to a 64×64 array of light-receiving area 11 were covered with a silicon oxide film, the recesses corresponding to the light-receiving areas 11 to be formed were immersed in a 10% hydrogen fluoride aqueous solution for 30 minutes and washed in ultrapure water where an amount of oxygen dissolved was below 30 ppb. Then a 0.1 μm-thick CdTe and a 2.9 μm-thick $Hg_{0.76}Cd_{0.24}Te$ film were continuously grown on the surface by an organometallic chemical vapor deposition method with the use of metal mercury, dimethylcadmium and diisopropyltellurium as feed materials. Thereafter, the CdTe and HgCdTe films deposited were removed from the areas other than the recesses corresponding to the light-receiving areas 11 to be formed to provide those light-receiving areas 11. A gold wiring 14 was formed between the light-receiving area 11 and the charge transfer area 13 with a silicon oxide film 15 provided therebetween. An aluminum wiring 16 was provided to make electric connection with the light-receiving area 11 and a ground line 17 was formed on a silicon wall 12 where the aluminum wiring 16 was provided.

Figure 3:
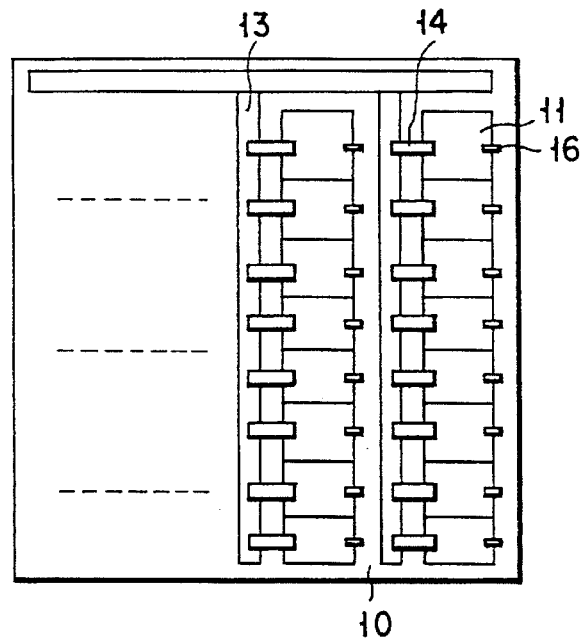
FIG. 3 is a plan view showing a semiconductor photoelectric converting device of the present invention.
Figure 4:
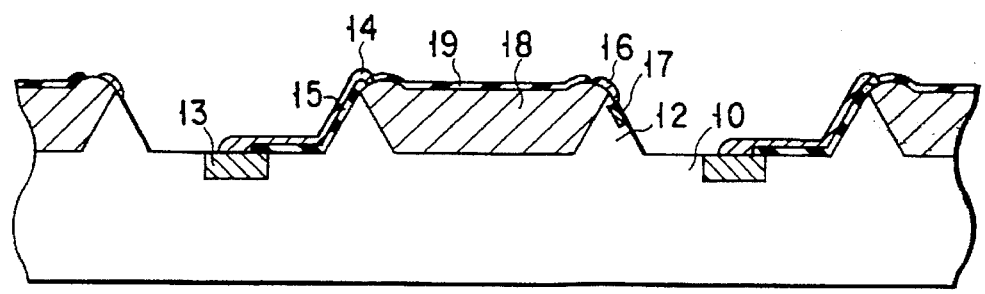
FIG. 4 is a cross-sectional view showing a portion of a semiconductor photoelectric converting device according to another embodiment of the present invention.

The semiconductor photoelectric converting device thus manufactured is shown in FIG. 3. The semiconductor photoelectric converting device is such that it can detect an infrared radiation of a 9.4 μm waveform with high sensitivity. The semiconductor photoelectric converting device was incorporated into an optical system equipped with a 9 to 9.5 μm bandpass filter and operated at room temperature without involving any chopping. When an infrared radiation with a wavelength of 9 to 9.5 μm is incident on the light-receiving area 11, an infrared radiation is absorbed in the light-receiving area 11, thus evolving heat. The evolution of the heat heats the light-receiving area 11 and silicon substrate to allow an expansion of the piezoelectric materials (CdTe and HgCdTe) filled in the light receiving area 11 and the silicon substrate 10. Since, at this time, there exists a difference in linear expansion coefficient between the silicon and the piezoelectric material, strain is produced in the piezoelectric material, thus leading to the generation of electric charges in the piezoelectric material. The electric charge is transferred by the gold wiring 14 to the charge transfer area. By such an operation it is possible to obtain better image information. Further, the sensitivity (NETD: a noise equivalent temperature difference) was 0.1 K., a value which was equivalent to that of a conventional HgCdTe infrared detector cooled to 77 K.

Although the present invention has been explained as using CdTe and HgCdTe as the piezoelectric material constituting the light-receiving area 11, the same better results as in the present embodiment were obtained in the case where a ZnO is grown by an organometallic chemical vapor deposition method with the use of dimethyl zinc and oxygen, in the case where InSb is grown with the use of trimethylindium and trimethylantimony and in the case where GaSb is grown with the use of trimethylgallium an trimethylantimony.

The following was the calculated output efficiency (piezo effect) on the semiconductor photoelectric converting device (piezoelectric material: PbTe, $Hg_{0.8}Cd_{0.2}Te$) of the present invention.

<PbTe>

| | |
|---|---|
| linear expansion coefficient: | $2.0 \times 10^{-5}$ $(K^{-1})$ |
| | $2.3 \times 10^{-6}$ $(K^{-1})$ |
| | (silicon) |
| pressure coefficient: | 127 (TPa) |
| pressure-sensitive area: | $20 \times 3 \times 2$ / |
| | $\sqrt{3}$ $(\mu m^2)$ |
| piezoelectric strain constant: | $20 \times 10^{-12}$ (C/N) |
| vacuum permittivity: | $8.9 \times 10^{-12}$ |
| relative inductivity: | 414 |
| electrode area: | $20 \times 10^{-6} \times 3 \times 10^{-6}$ $(m^2)$ |
| interelectrode distance: | $20 \times 10^{-6}$ (m) |

First, a pressure produced at a 1° C. temperature variation is found from a difference in a linear expansion coefficient (k) between the piezoelectric material and the silicon substrate and a pressure coefficient.

the difference between linear expansion
coefficients $(k_{PbTe} - k_{Si})$ / pressure coefficient =
$\{(2 \times 10^{-5} - 2.3 \times 10^{-6}) / 127\} \times 10^{12}$ =
$1.4 \times 10^5$ (Pa)

Then a force on the crystal resulting from a 1° C. temperature variation is found from a pressure produced due to the 1° C. temperature variation and the pressure-sensitive area.

pressure produced at a 1° C. temperature variation ×
the pressure-sensitivity area =
$1.4 \times 10^5 \times 20 \times 10^{-6} \times 3 \times 10^{-6} \times 2 / \sqrt{3}$ =
$9.7 \times 10^{-6}$ (N)

The polarization charges are found from the force applied on the crystal and piezoelectric strain constant.

force applied on the crystal × piezoelectric
strain constant =
$9.7 \times 10^{-6} \times 20 \times 10^{-12}$ =
$1.9 \times 10^{-16}$ (C)

Finally, an output efficiency, that is, a voltage produced at the 1° C. temperature variation, is found from the polarization charge and electric capacity of the device.

electric capacity of the device = vacuum
permittivity × relative inductivity × electrode
area × interelectrode distance =

-continued 8.9 × $10^{-12}$ × 414 × 20 × $10^{-6}$ × 3 × $10^{-6}$ /
20 × $10^{-6}$ =
1.1 × $10^{-14}$
polarization charge/electric capacity of device =
1.9 × $10^{-16}$ / 1.1 × $10^{-14}$ =
17 mV / °C.

In the semiconductor photoelectric converting device of the present invention, the output efficiency was 17 mV. Since the output efficiency (Seebeck effect) of the Seebeck type device using PbTe was 0.4 mV/°C., the semiconductor photoelectric converting element using PbTe revealed about 40 times as high an output efficiency as that of the conventional Seebeck type device.

<$Hg_{0.8}Cd_{0.2}Te$>

| | |
|---|---|
| linear expansion coefficient: | 4.7 × $10^{-6}$ ($K^{-1}$) |
| pressure efficiency: | 65 (TPa) |
| pressure-sensitive area: | 20 × 3 × 2 / $\sqrt{3}$ ($\mu m^*$) |
| piezoelectric strain constant: | 8 × $10^{-12}$ (C/N) |
| vacuum permittivity: | 8.9 × $10^{-12}$ |
| relative inductivity: | 17.8 |
| electrode area: | 20 × $10^{-6}$ × 3 × $10^{-6}$ ($m^2$) |
| interelectrode distance: | 20 × $10^{-6}$ (m) |

The output coefficient (piezo effect) was calculated based on the above-mentioned information as in the case of PbTe to find 44 mV/°C. In contrast with 0.4 mV/°C., that is, the output efficiency (Seebeck effect) of the Seebeck type device using $Hg_{0.8}Cd_{0.2}Te$, the semiconductor photoelectric converting device of the present invention using $Hg_{0.8}Cd0.2Te$ revealed about 110 times as high an output coefficient as that of the conventional Seebeck type device.

(Second Embodiment)

Forming a light-receiving area 11 with the use of a piezoelectric layer 18 and light absorption layer 19 will be explained below in conjunction with this embodiment. First, as in the first embodiment, recesses and grooves were formed in the surface portion of a silicon substrate 10 and charge transfer areas 13 were formed in those corresponding grooves 13, followed by the washing of the recesses corresponding to light-receiving areas 11 to be formed. Then an about 3 μm-thick ZnTe was grown on a surface by an organometallic chemical vapor deposition method with the use of dimethyl zinc (DMZn) and diethyl terrulium (DETe) to create piezoelectric layers 18. Then a 100 nm-thick polyimide film was formed as the light-absorption layer 19. Thereafter, the ZnTe and polyimide film deposited were removed from those recesses corresponding to the light-receiving area 11 to be formed to provide light-receiving areas 11. Finally, a gold wiring 14 and aluminum wiring 16 were formed as in the same way as in the first embodiment.

This semiconductor photoelectric converting device can detect an infrared radiation of a 9.4 μm wavelength with high sensitivity. The device was incorporated into an optical system equipped with a 9 to 9.5 μm bandpass filter and, without involving any chopping, was operated at room temperature. By doing so, a better image was obtained as in the case of the first embodiment. The sensitivity (NETD: a noise equivalent temperature difference) was 0.08 K., a value which was equivalent to that of the conventional HgCdTe infrared radiation detector cooled to 77 K.

(Third Embodiment)

Figure 5:
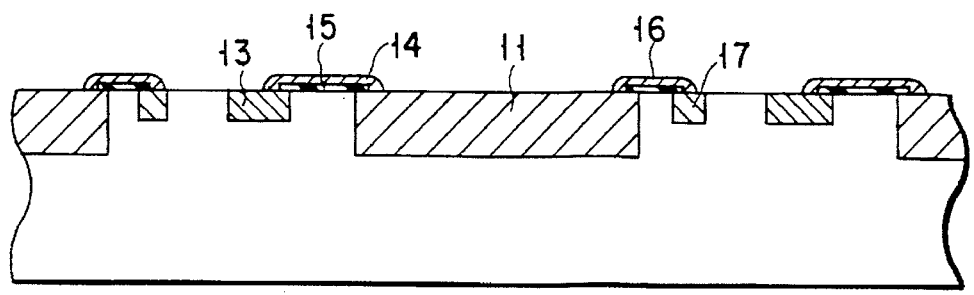
FIG. 5 is a cross-sectional view showing a portion of a semiconductor photoelectric converting device according to another embodiment of the present invention.

Forming trenches in the surface portion of a silicon substrate and providing light-receiving areas 11 as shown in FIG. 5 will be explained below in conjunction with this embodiment. This device is of such a type as to read, as a signal, a potential difference in a longitudinal direction of the light-receiving area 11.

In the manufacture of the device, grooves were formed in the surface portion of a silicon substrate as in the same way as in the first embodiment and corresponding charge transfer areas 13 were formed. In those areas corresponding to the light receiving areas 11 to be formed, a groove of 2 μm wide×20 μm long×5 μm deep was formed by a reactive ion etching method. Then, in the same way as in the first embodiment, a 5 μm-thick $Hg_{0.76}d_{0.24}Te$ film was formed by an organometallic chemical vapor deposition method to provide a light-receiving area 11. Finally, a gold wiring 14 and aluminum wiring 16 was formed as shown in FIG. 5.

This device can detect an infrared radiation of a 9.4 μm wavelength with high sensitivity. The device was incorporated into an optical system equipped with a 9 to 9.5 μm bandpass filter and was operated at room temperature without involving any chopping. By doing so it is possible to obtain better image information in the same way as in Example 1. The sensitivity (NETD: a noise equivalent temperature difference) was 0.08 K., a value which was equivalent to that of the conventional HgCdTe detector cooled at 77 K.

(Fourth Embodiment)

Figure 6:
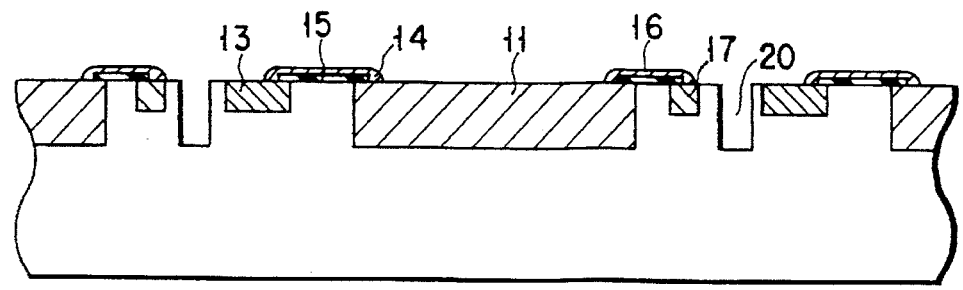
FIG. 6 is a cross-sectional view showing a portion of a semiconductor photoelectric converting device according to another embodiment of the present invention.

Achieving a pixel-to-pixel separation (heat separation) with the use of trench structures as shown in FIG. 6 will be explained below.

In the manufacture of this embodiment, grooves were formed in the surface portion of a silicon substrate and charge transfer areas 13 were provided as shown in the first embodiment. After, at those areas corresponding to light-receiving areas 11 to be formed, a groove of 2 μm wide×20 μm long×5 μm deep and an element-to-element separation groove 20 of 2 μm wide×5 μm deep were etched by the reactive ion etching method, a 5 μm-thick $Hg_{0.76}Cd_{0.24}Te$ film was grown on a surface by an organometallic chemical vapor growth method as in the first embodiment to provide light-receiving areas 11 and finally a gold wiring 14 and aluminum wiring 16 were formed as shown in FIG. 6.

The semiconductor photoelectrical converting device can detect an infrared radiation of a 9.4 μm wavelength with high sensitivity. The device was incorporated into an optical system equipped with a 9 to 9.5 μm bandpass filter and operated at room temperature without involving any chopping. By doing so it was possible to obtain better image information as in the first embodiment. Further, the sensitivity (NETD: a noise equivalent temperature difference) was 0.07 K., a value which was equivalent to the conventional HgCdTe infrared detector cooled at 77 K. It was possible to obtain a sharp image.

(Fifth Embodiment)

Figure 7:
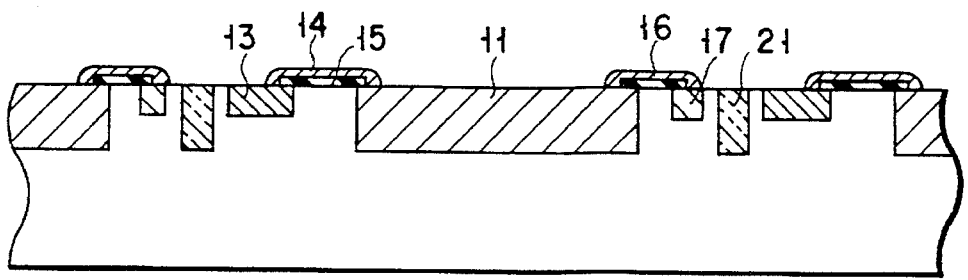
FIG. 7 is a cross-sectional view showing a portion of a semiconductor photoelectric converting device according to another embodiment of the present invention.

Filling a larger heat capacity-possessing dielectric material or organic material (heat-resistant material) 21 in a corresponding pixel-to-pixel separation trench as shown in FIG. 7 and, by doing so, enhancing an element separation effect will be explained below.

In the manufacture of this semiconductor photoelectrical converting device, as in the fourth embodiment, charge transfer areas 13 were formed in the surface portion of a silicon substrate, grooves and element-to-element separation grooves 20 were formed by a reactive ion etching method, $Hg_{0.76}Cd_{0.24}Te$ films were grown on a surface by the organometallic chemical vapor deposition method to provide light-receiving areas 11. Thereafter, the element-to-element separation groove 20 was filled with a material, such as a PZT and polyimide, smaller in heat conductivity than air. Finally a gold wiring 14 and aluminum wiring 16 were formed as shown in FIG. 7.

The device obtained can detect an infrared radiation of a 9.4 μm wavelength with high sensitivity. The device was incorporated into an optical system equipped with a 9 to 9.5 μm bandpass filter and operated at room temperature without involving any chopping. A still better image was obtained than that in the fourth embodiment because the element-to-element separation effect is enhanced. The sensitivity (NETD: a noise equivalent temperature difference) was 0.07 K., a value which was equivalent to that on the conventional HgCdTe infrared detector cooled to 77 K. By making the depth of the element-to-element separation groove greater than that of the light-receiving area 11 it was possible to obtain excellent image.

(Sixth Embodiment)

An imaging device apparatus using a semiconductor photoelectric converting device of the present invention will be explained below.

Figure 8:
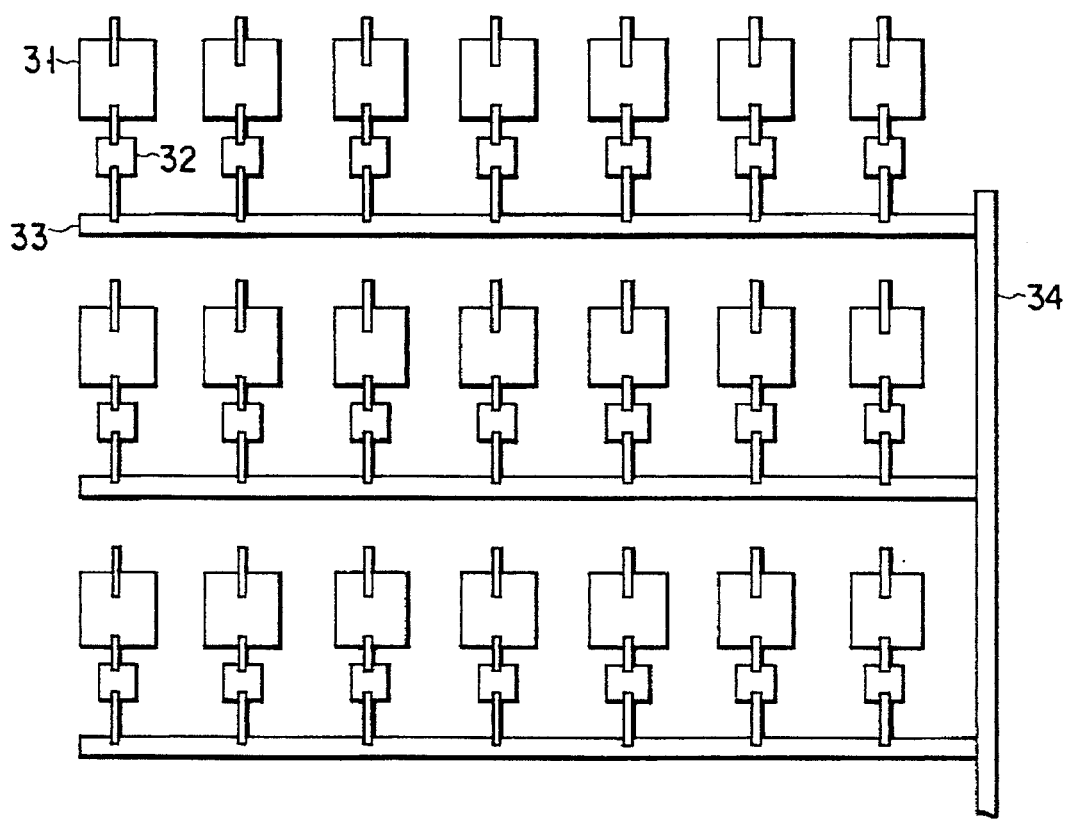
FIG. 8 is a view for explaining a semiconductor photoelectric converting device array of the present invention.

FIG. 8 shows an array of semiconductor photo-electric converting elements of the present invention. Numeral 31 shows a light-receiving area of a respective semiconductor photoelectric converting device. Those light-receiving areas and charge transfer areas at the semiconductor substrate are so arranged that on a per-pixel basis the light-receiving area is connected via a corresponding preamplifier 32 to a corresponding horizontal CCD 33. Those horizontal CCD's 33 are connected to a vertical CCD 34.

Figure 9:
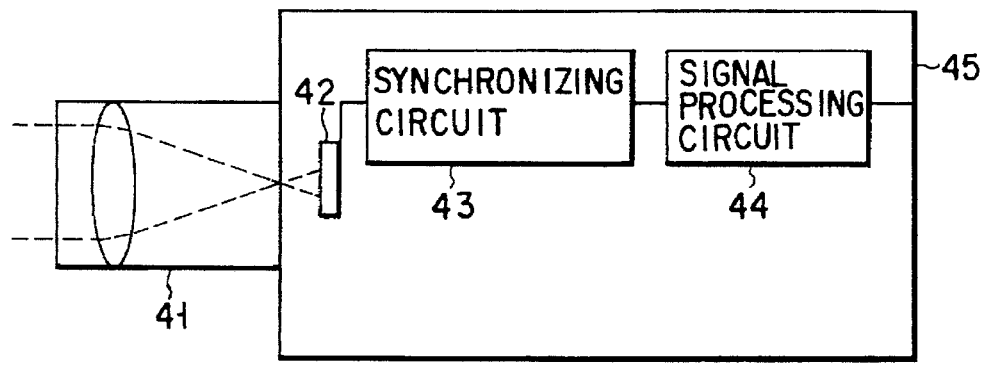
FIG. 9 is a view for explaining an imaging device apparatus of the present invention.

The imaging device of the present invention is such that, as shown in FIG. 9, those light-receiving areas of a semiconductor photoelectric converting element array 42 are oriented at an optical system 41, such as a Ge lens, etc. Further, the CCD's 33 and 34 in the semiconductor photoelectric converting element array 42 are electrically connected to a synchronizing circuit 43 which, in turn, is electrically connected to a signal processing circuit 44.

In the imaging device thus arranged, a light beam (infrared beam) condensed by the optical system 41 are incident on the semiconductor photoelectric converting element array 42. At this time, heat is generated, in the presence of an infrared radiation, in the light-receiving areas. By the heat generated, the light-receiving areas and semiconductor substrate are heated to allow expansion of the piezoelectric materials filled in the light-receiving areas. At this time, strain is developed in the piezoelectric material due to a difference in linear expansion coefficient between the semiconductor substrate material and the piezoelectric material. When this occurs, electric charges are generated in the piezoelectric material. These electric charges are injected by the preamplifiers 32 into the CCD's 33 and 34.

By utilizing this function, the semiconductor photoelectric converting elements are driven by the synchronizing circuit 43 in an NTSC (National Television System Committee) timing. A corresponding signal is given, by the signal processing circuit 44, a contrast fitted to an object and amplified to, for example, 1 Vp-p. An output signal 45 of the signal processing circuit 44 is input straight to an input terminal of a CRT monitor, not shown. By doing so it is possible to obtain an infrared image simply and accurately.

Although in the above-mentioned embodiment, an explanation has been made about the case where the charge transfer areas and light-receiving areas are formed at the semiconductor substrate, the present invention can be applied to any proper structure in the case where electric charges generated by a piezo effect resulting from heat evolved when light is incident upon the light-receiving areas are conducted to the charge transfer areas. For example, the present invention can also be applied to the case where light-receiving areas possessing a specific arrangement according to the invention are formed at a glass substrate and charge transfer areas are formed at a silicon substrate in which both the substrates are electrically connected to each other.

As will be appreciated from the above, the semiconductor photoelectric converting device includes charge transfer areas formed at the semiconductor substrate and light-receiving areas electrically connected to the charge transfer areas and formed in contact with the semiconductor substrate. Since the electric charges generated by a piezo effect utilizing strain caused by heat evolved when light is incident upon the light-receiving areas are conducted to charge transfer areas, the present device can be used either at room temperature or at a temperature which can be cooled by an electronic cooler utilizing a Peltier effect. It is, therefore, possible to achieve a high-sensitive device while achieving a faster response speed. In the semiconductor photoelectric converting device of the present invention it is thus possible to achieve a faster response speed and achieve thinner light-receiving layers at the light-receiving areas and hence a thinned device.

Further, the semiconductor photoelectric converting element of the present invention can form charge transfer areas and light-receiving areas in an integral unit due to the use of a semiconductor substrate and can be realized as a small-sized unit. Further, it is possible to allow the use of a material capable of being epitaxially grown on a semiconductor substrate and to broaden the applicable range of materials used.

An imaging device can also be obtained which ensures high sensitivity at a temperature set out above by providing a semiconductor photoelectrical converting element on a per-pixel basis and transferring electric charges from charge transfer areas by the use of a drive section.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor photoelectric converting device comprising:

a semiconductor substrate of a material having a first linear expansion coefficient;

an electric charge transfer area provided in a surface portion of said semiconductor substrate;

a light-receiving area including piezoelectric material in contact with the semiconductor substrate, said piezoelectric material having a second linear expansion coefficient different from said first linear expansion coefficient; and a connector electrically connecting the piezoelectric material to the electric charge transfer area, wherein light absorbed by the light-receiving area generates heat that introduces strain into the piezoelectric material because of the difference between the first and second linear expansion coefficients, said strain further causing electric charges to be generated in the piezoelectric material which are conducted to the electric charge transfer area by the connector.

2. The device according to claim 1, wherein the piezoelectric material is a material having a detection wavelength longer than 3 µm.

3. The device according to claim 1, wherein the piezoelectric material is at least one selected from the group consisting of PbTe, HgTe, $Hg_{1-x}Cd_xTe$ ($0.2 \leq x \leq 0.3$), InSb, $Cd_3As_2$, $Bi_2Te_3$ and $PtSb_2$.

4. The device according to claim 1, wherein the semiconductor substrate is one of a silicon substrate and a GaAs substrate.

5. The device according to claim 1, wherein the light is infrared light with a wavelength of 0.8 to 20 µm.

6. The device according to claim 1, wherein the light-receiving area further includes a light absorption layer for absorbing the light to produce the heat, and wherein the piezoelectric material is expanded due to the heat produced in the light absorption layer which produces the strain to generate the electric charges.

7. The device according to claim 6, wherein the light absorption layer is made of a polyimide or cyclopentadiene derivative.

8. The device according to claim 6, wherein the material of the piezoelectric layer is selected from the group consisting of ZnTe, ZnO, InSb, GaP and GaSb.

9. The device according to claim 1, wherein the light-receiving area has a depth of 1 to 20 µm.

10. The device according to claim 1, wherein the semiconductor substrate is a silicon substrate and the light-receiving area is defined by a plane.

11. The device according to claim 1, wherein the light-receiving area is buried in a recess in an uneven surface portion of the semiconductor substrate.

12. The device according to claim 11, wherein a trench is provided on a convex portion of an uneven surface of the semiconductor substrate.

13. An imaging device comprising:

a semiconductor substrate of a material having a first linear expansion coefficient;

plural semiconductor photoelectric converting devices mounted on said substrate;

each one of said plural semiconductor photoelectric converting devices having an electric charge transfer area provided in a surface portion of the semiconductor substrate and an associated light-receiving area including piezoelectric material in contact with the semiconductor substrate, said piezoelectric material having a second linear expansion coefficient different from said first linear expansion coefficient;

a connector electrically connecting the piezoelectric material of each light-receiving area to the associated electric charge transfer area; and drive means for transferring electric charges from the charge transfer areas, wherein light absorbed by the light receiving area of each photoelectric converting device generates heat that introduces strain into the piezoelectric material of each photoelectric converting device because of the difference between the first and second linear expansion coefficients, said strain further causing electric charges to be generated in the piezoelectric material of each photoelectric converting device which are conducted to the electric charge transfer area of each photoelectric converting device.

14. The device according to claim 13, wherein the piezoelectric material is a material having a detection wavelength longer than 3 µm.

15. The device according to claim 13, wherein the piezoelectric material is at least one selected from the group consisting of PbTe, HgTe, $Hg_{1-x}Cd_xTe$ ($0.2 \leq x \leq 0.3$), InSb, $Cd_3As_2$, $Bi_2Te_3$ and $PtSb_2$.

16. The device according to claim 13, wherein the light is infrared light with a wavelength of 0.8 to 20 µm.

17. The device according to claim 13, wherein the light-receiving area further includes a light absorption layer for absorbing the light to produce the heat, and wherein the piezoelectric material is expanded due to the heat produced in the light absorption layer which produces the strain to generate the electric charges.

18. The device according to claim 13, wherein the semiconductor substrate is a silicon substrate and the light-receiving area is defined by a plane.

19. The device according to claim 13, wherein the light-receiving area is buried in a recess in an uneven surface portion of the semiconductor substrate.

20. The device according to claim 19, wherein a trench is provided on an uneven surface portion of the semiconductor substrate.

* * * * *